(12) United States Patent
Luo et al.

(10) Patent No.: US 12,326,993 B2
(45) Date of Patent: Jun. 10, 2025

(54) DISPLAY MODULE AND TOUCH DISPLAY DEVICE

(71) Applicants: Chongqing BOE Optoelectronics Technology Co., Ltd., Chongqing (CN); BOE Technology Group Co., Ltd., Beijing (CN); Beijing BOE Technology Development Co., Ltd., Beijing (CN)

(72) Inventors: Zhongli Luo, Beijing (CN); Xiaofeng Yin, Beijing (CN); Kangpeng Dang, Beijing (CN); Bo Wang, Beijing (CN); Xiong Guo, Beijing (CN); Cheng Zuo, Beijing (CN); Hong Chen, Beijing (CN); Hebing Xu, Beijing (CN); Kuan Li, Beijing (CN); Xingyu Pu, Beijing (CN); Yuhong Sun, Beijing (CN); Yuansheng Tang, Beijing (CN)

(73) Assignees: CHONGQING BOE OPTOELECTRONICS TECHNOLOGY CO., LTD., Chongqing (CN); BOE TECHNOLOGY GROUP CO., LTD., Beijing (CN); BEIJING BOE TECHNOLOGY DEVELOPMENT CO., LTD., Beijing (CN)

(*) Notice: Subject to any disclaimer, the term of this patent is extended or adjusted under 35 U.S.C. 154(b) by 0 days.

(21) Appl. No.: 18/633,015

(22) Filed: Apr. 11, 2024

(65) Prior Publication Data

US 2024/0361864 A1 Oct. 31, 2024

Related U.S. Application Data

(63) Continuation of application No. PCT/CN2023/090819, filed on Apr. 26, 2023.

(51) Int. Cl.
G06F 3/041 (2006.01)
H05K 1/18 (2006.01)

(52) U.S. Cl.
CPC ........ *G06F 3/04164* (2019.05); *G06F 3/0412* (2013.01); *G06F 3/04166* (2019.05); *H05K 1/189* (2013.01); *H05K 2201/10128* (2013.01)

(58) Field of Classification Search
CPC .............. G06F 3/0412; G06F 3/04164; G06F 3/04166; H05K 1/189; H05K 2201/10128
(Continued)

(56) References Cited

U.S. PATENT DOCUMENTS 10,963,114 B1\* 3/2021 Huang ................ G06F 3/04164
2020/0133420 A1\* 4/2020 Lu ......................... G02F 1/1345
(Continued)

FOREIGN PATENT DOCUMENTS

| CN | 107887399 A | * | 4/2018 | ............. H01L 27/12 |
| CN | 110930941 A | * | 3/2020 | |
| WO | WO-2022246680 A1 | * | 12/2022 | ........... G06F 3/0412 |

OTHER PUBLICATIONS

PCT/CN2023/090819 Written Opinion (Translated) Dec. 21, 2023. (Year: 2023).*

*Primary Examiner* — Julie Anne Watko
(74) *Attorney, Agent, or Firm* — WHDA, LLP

(57) ABSTRACT

A display module and a touch display device are provided by the present application, which relates to the technical field of displaying. At least one driving chip is provided within the bonding region. The mainboard includes a power-supply chip. For a same driving chip, a resistance value between a first output terminal of the driving chip and the power-supply chip is substantially equal to a resistance value between a second output terminal of the driving chip and the power-supply chip, wherein the first output terminal refers to the output terminal that has the lowest distance to the first (Continued)

side edge, and the second output terminal refers to the output terminal that has the lowest distance to the second side edge. The display module is used to manufacture a touch display device.

20 Claims, 6 Drawing Sheets

(58) Field of Classification Search
USPC .................................................. 345/173, 174
See application file for complete search history.

(56) References Cited

U.S. PATENT DOCUMENTS

2022/0365392 A1* 11/2022 Liu .................... G02F 1/133612
2024/0196673 A1*  6/2024 Wu ........................ G06F 3/0446
2024/0241597 A1*  7/2024 Wang ...................... G06F 3/041

* cited by examiner

DISPLAY MODULE AND TOUCH DISPLAY DEVICE

TECHNICAL FIELD

The present application relates to the technical field of displaying and, more particularly, to a display module and a touch display device.

BACKGROUND

With the rapid development of the display industry and the updating of the display technique, consumers pay more attention to the image quality of display products. Therefore, high-image-quality display products having a high resolution, a high transmittance, a high contrast, a high color gamut and so on have become the favorite products for increasingly more consumers.

SUMMARY

The following technical solutions are employed by the embodiments of the present application:

In a first aspect, a display module is provided by an embodiment of the present application, wherein the display module includes an active area and a bonding region located at one side of the active area; wherein a plurality of touch signal lines and a plurality of common-electrode units are provided within the active area, and the common-electrode units are electrically connected to the touch signal lines; at least one driving chip is provided within the bonding region; the display module further includes a mainboard, and the mainboard includes a power-supply chip;

each of the at least one driving chip includes a plurality of output terminals and at least one input terminal; the output terminals are electrically connected to the touch signal lines, and each of the at least one input terminal is electrically connected to the power-supply chip;

each of the at least one driving chip includes a first side edge and a second side edge that are opposite, and both of the first side edge and the second side edge extend in a direction from the active area pointing to the bonding region; and for a same instance of the at least one driving chip, a resistance value between a first output terminal of the driving chip and the power-supply chip is substantially equal to a resistance value between a second output terminal of the driving chip and the power-supply chip, wherein the first output terminal refers to an instance of the output terminals that has a lowest distance to the first side edge, and the second output terminal refers to an instance of the output terminals that has a lowest distance to the second side edge.

In at least one embodiment of the present application, each of the at least one driving chip includes a first signal line, and the first signal line contacts and is connected to all of the output terminals, and is electrically connected to the input terminal; and a resistance between the first output terminal and a midpoint of the first signal line is substantially equal to a resistance between the second output terminal and the midpoint of the first signal line.

In at least one embodiment of the present application, the first signal line is indirectly electrically connected to the input terminal.

In at least one embodiment of the present application, each of the at least one driving chip further includes a second signal line and a third signal line, an extending trend of the second signal line is the same as an extending trend of the first signal line, and an extending trend of the third signal line intersects with the extending trend of the second signal line; one end of the third signal line contacts and is connected to a midpoint position of the first signal line, and the other end of the third signal line is electrically connected to the second signal line; and the input terminal of each of the at least one driving chip is disposed on one of the first side edge and the second side edge, and the input terminal contacts and is connected to one end of the second signal line.

In at least one embodiment of the present application, the first signal line directly contacts and is directly connected to the input terminal.

In at least one embodiment of the present application, each of the at least one driving chip includes two instances of the input terminal, the two input terminals are disposed on the first side edge and the second side edge, respectively, and the two input terminals contact and are connected to two ends of the first signal line.

In at least one embodiment of the present application, the display module further includes at least one flexible circuit board and at least one power-supply-signal transmitting line set; the power-supply chip, the at least one flexible circuit board and the input terminal of each of the at least one driving chip are sequentially electrically connected; a quantity of the driving chip, a quantity of the at least one flexible circuit board and a quantity of the power-supply-signal transmitting line set are equal;

the power-supply-signal transmitting line set includes at least one power-supply-signal transmitting line, each of the at least one power-supply-signal transmitting line passes through each of the at least one flexible circuit board from the mainboard and extends to the bonding region, and the power-supply-signal transmitting line is electrically connected to the input terminal of each of the at least one driving chip; and a quantity of the at least one power-supply-signal transmitting line passing through a same flexible circuit board in the power-supply-signal transmitting line set is equal to a quantity of the input terminal of a same driving chip electrically connected to the flexible circuit board.

In at least one embodiment of the present application, a first bonding part and a plurality of first connecting lines are provided within the bonding region, the first bonding part is located at one side of the at least one driving chip away from the active area, and the first bonding part is electrically connected to the flexible circuit board and the first connecting lines; and when each of the at least one driving chip includes two instances of the input terminal, the first connecting lines include a first part and a second part, the first connecting lines of the first part are electrically connected to the first bonding part and one of the input terminals, and the first connecting lines of the second part are electrically connected to the first bonding part and the other of the input terminals.

In at least one embodiment of the present application, each of the at least one driving chip includes a first storing unit, a second storing unit, a converting unit and a touch unit, and the first storing unit, the second storing unit and the touch unit are electrically connected to the converting unit, respectively; a plurality of pixel driving circuits arranged in an array and a plurality of data-signal lines are provided within the active area, and one of the plurality of data-signal lines is electrically connected to a same row of the pixel driving circuits; the converting unit is electrically connected to the data-signal lines and the touch signal lines;

the first storing unit is configured to store a displayed data signal, the second storing unit is configured to store a common-voltage signal, and the touch unit is configured to store a touch signal;

at a display stage, the converting unit is configured to control the first storing unit and the data-signal lines to be conducted, and is further configured to control the second storing unit and the touch signal lines to be conducted; and at a touch stage, the converting unit is configured to control the touch unit to be conducted with the data-signal lines and the touch signal lines, respectively.

In at least one embodiment of the present application, the display module includes at least two driving chips and at least two power-supply-signal transmitting line sets, each power-supply-signal transmitting line set includes at least one power-supply-signal transmitting line, the at least one power-supply-signal transmitting line passes through a flexible circuit board from the mainboard and extend to the bonding region, and the at least one power-supply-signal transmitting line is electrically connected to the at least one input terminal of each of the at least one driving chip;

each of the at least one power-supply-signal transmitting line includes a first line segment, the first line segment is disposed on the mainboard, and the first line segment is connected to the flexible circuit board and the power-supply chip; and the mainboard further includes a resistance regulating module, and at least a part of the first line segment is provided with the resistance regulating module.

In at least one embodiment of the present application, each first line segment is provided with the resistance regulating module, and the resistance regulating module includes an adjustable resistor.

In at least one embodiment of the present application, each driving chip includes one input terminal, the display module includes a first driving chip and a second driving chip, and both of the input terminal of the first driving chip and the input terminal of the second driving chip are located on the first side edge or located on the second side edge;

the first driving chip is configured to control a first region within the active area, the second driving chip is configured to control a second region within the active area, and an initial brightness of the first region is greater than an initial brightness of the second region; and the first line segment electrically connected to the first driving chip is provided with the resistance regulating module.

In at least one embodiment of the present application, a resistance value of the resistance regulating module is substantially equal to an internal-resistance value of the second driving chip.

In at least one embodiment of the present application, orthographic projections of at least a part of line segments of the data-signal lines on a substrate of the display module overlap with orthographic projections of the common-electrode units on the substrate; and at the touch stage, all of the data-signal lines and the touch signal lines are configured to transmit scanning square signals, and polarities of the scanning square signals that are transmitted by the data-signal lines and the touch signal lines are the same.

In the second aspect, a touch display device is provided by an embodiment of the present application, wherein the touch display device includes the display module described above.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are merely embodiments of the present application, and a person skilled in the art can obtain other figures according to these figures without paying creative work.

DETAILED DESCRIPTION

Figure 1:
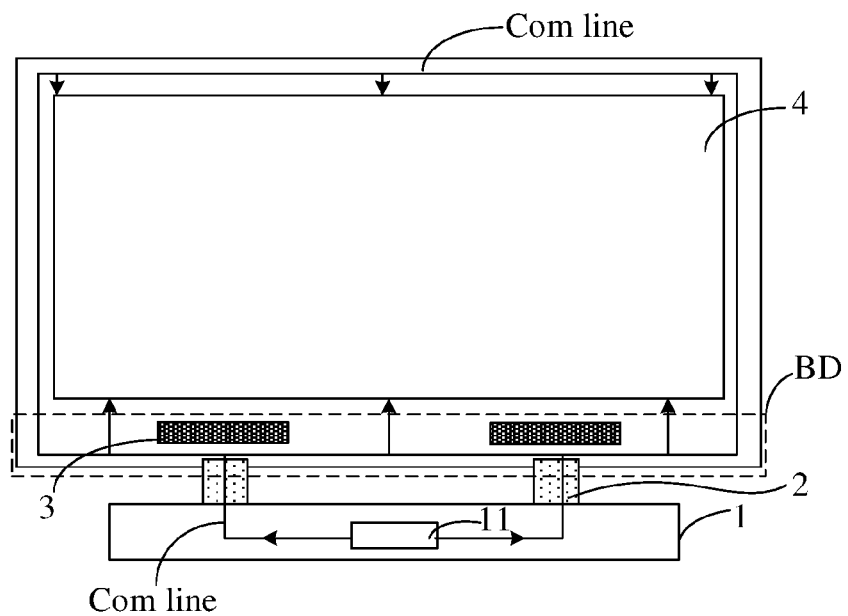
FIG. 1 is a schematic structural diagram of a non-touch display module according to an embodiment of the present application.

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

In the embodiments of the present application, terms such as "first", "second", "third" and "fourth" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

In the embodiments of the present application, the terms that indicate orientation or position relations, such as "upper" and "lower", are based on the orientation or position relations shown in the drawings, and are merely for conveniently describing the present application and simplifying the description, rather than indicating or implying that the device or element must have the specific orientation and be constructed and operated according to the specific orientation. Therefore, they should not be construed as a limitation on the present application.

In the description of the present disclosure, the terms "one embodiment", "some embodiments", "exemplary embodiment", "example", "specific example" or "some examples" are intended to indicate that specific features, structures, materials or characteristics related to the embodiment or example are included in at least one embodiment or example of the present application. The illustrative indication of the above terms does not necessarily refer to the same embodiment or example. Moreover, the specific features, structures, materials or characteristics may be included in any one or more embodiments or examples in any suitable manner.

In the embodiments of the present application, the meaning of "plurality of" is "two or more", and the meaning of "at least one" is "one or more", unless explicitly and particularly defined otherwise.

All of the features used in the embodiments of the present application of "parallel", "perpendicular", "the same" and so on include the features of "parallel", "perpendicular", "the same" and so on in the strict sense, and include the cases in which there is a certain tolerance such as "substantially parallel", "substantially perpendicular" and "substantially the same", taking into consideration the measurement and the tolerances relevant to the measurement on particular quantities (for example, restricted by the measuring system), and represent that they are in the acceptable deviation ranges of the particular values determined by a person skilled in the art. For example, the "substantially" can represent that they are within one or more standard deviations, or within 10% or 5% of the values.

Unless stated otherwise in the context, throughout the description and the claims, the term "include" is interpreted as the meaning of opened containing, i.e., "including but not limited to".

The "same layer" according to the embodiments of the present application refers to the relation between multiple film layers that are formed by using the same material after the same step (for example, a one-step patterning step). The "same layer" used herein does not always refer to that the thickness of a plurality of film layers are equal or that the heights in a cross-sectional view of a plurality of film layers are equal. The polygons in the description are not the strictly defined polygons, may be an approximate triangle, parallelogram, trapezoid, pentagon, hexagon and so on, and may have some small deformations caused by rounded corners or tolerance.

In the embodiments of the present application, the term "electric connection" may refer to that two components are directly electrically connected, and may also refer to that two components are electrically connected by one or more other components.

In the description, the "electric connection" includes the cases in which the component elements are connected together by an element having a certain electric function. The "element having a certain electric function" is merely required to be able to perform the receiving of an electric signal between the connected component elements, and is not particularly limited further. The examples of the "element having a certain electric function" do not only include electrodes and wires, but also include switching elements such as transistors, resistors, inductors, capacitors and other elements having various functions.

As shown in FIG. 1, a non-touch display product includes a full-face common-electrode 4. A common-electrode line (Com line), after exported from the flexible circuit board 2, does not pass through the driving chip 3, and the common-electrode line (Com line) is wired around the common-electrode 4, and is electrically connected to the common-electrode 4 at a plurality of positions of the peripheral region, to prevent the problem that the connection at a single point results in that the voltage drop (IR Drop) of the different regions of the common-electrode 4 is high.

Figure 2:
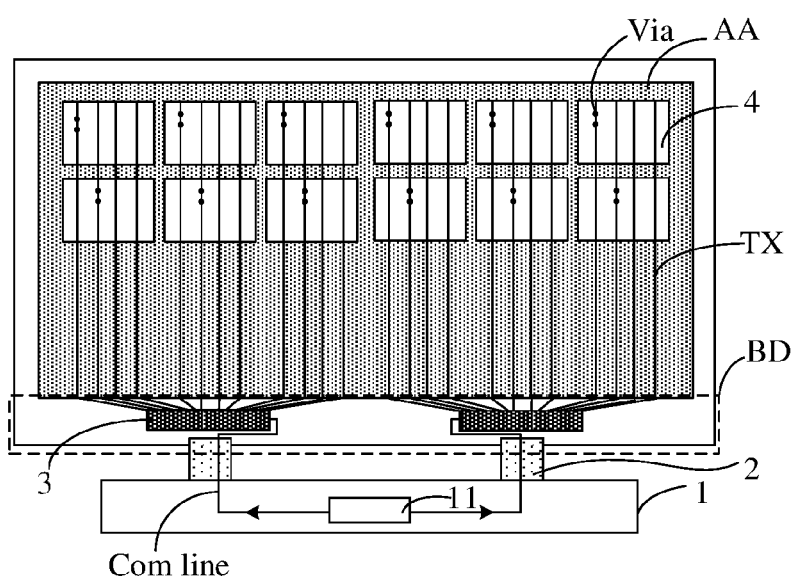
FIG. 2 is a schematic structural diagram of a touch display module according to an embodiment of the present application.

As shown in FIG. 2, regarding a touch display product, as compared with the non-touch display product shown in FIG. 1, in order to realize a function of touch controlling, a plurality of common-electrode blocks 4 are provided. At the display stage, common-voltage signals are transmitted in the common-electrode blocks 4 (which are also referred to as Sensor electrodes), and at the touch stage, touch signals are transmitted in the common-electrode blocks 4. In other words, by the time division multiplexing of the common-electrode blocks 4, the functions of displaying and touch controlling are realized at the same time. Because, at the touch stage, it is required to supply the touch signals for the common-electrode blocks 4, after the common-electrode line (Com line) are exported from the flexible circuit board 2, it is required to pass through the driving chips 3, and subsequently supply the signals for the active area AA via the output terminals of the driving chips 3. In this way, the driving chips 3, at the touch stage, can be caused to transmit the touch signals to the touch signal lines TX via the common-electrode line (Com line). The common-electrode blocks 4 are electrically connected to the common-electrode line (Com line) by using the touch signal lines TX.

However, in practical applications, the common-electrode blocks 4 inevitably have an overlapping part with the positions of the data-signal lines (Data lines, which are also referred to as Source lines and are not shown in FIG. 2), and, in this way, there are parasitic capacitances between the data-signal lines and the common-electrode blocks 4. When the signals transmitted in the data-signal lines are performed polarity reversal, the signals in the common-electrode blocks 4 are pulled in the same direction, which results in instability of the signals transmitted in the common-electrode blocks 4. When frames are displayed, the decreasing of the frame brightness may be caused and the display is darkened. For high-resolution or high-refresh-rate display products, that phenomenon is particularly significant. In addition, when the common-electrode line (Com line) itself transmitting the common-voltage signal has a high resistance value, the signals in the common-electrode blocks 4, after pulled, require a long duration of the recovery, and the phenomenon of the brightness decreasing of the display frame within the local region is more significant.

In view of this, a display module is provided by an embodiment of the present application. As shown in FIG. 2, the display module includes an active area AA and a bonding region BD located at one side of the active area. A plurality of touch signal lines TX and a plurality of common-electrode units 4 are provided within the active area AA, and the common-electrode units 4 are electrically connected to the touch signal lines TX. At least one driving chip 3 is provided within the bonding region BD. The display module further includes a mainboard 1, and the mainboard 1 includes a power-supply chip 11.

Figure 6:
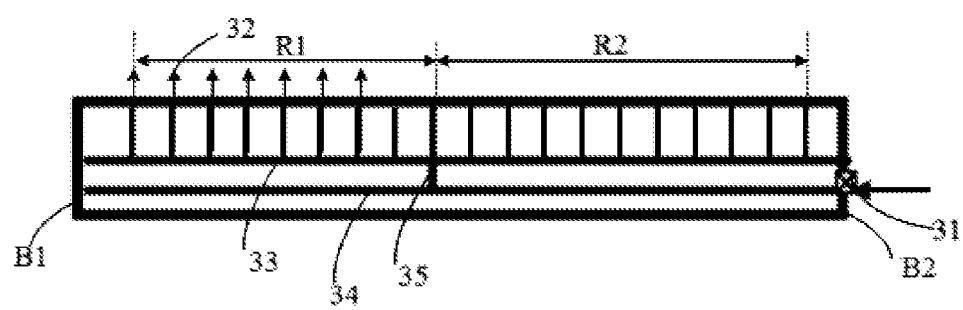
FIGS. 6 and 7 are simplified schematic structural diagrams of two types of driving chips according to embodiments of the present application.
Figure 7:
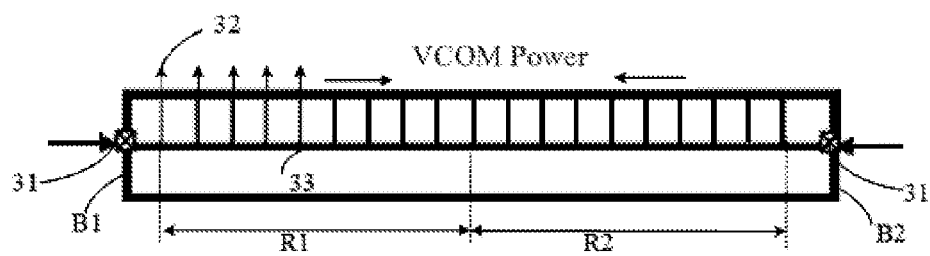

As shown in FIG. 6 or 7, the driving chip 3 includes a plurality of output terminals 32 and at least one input terminal 31. The output terminals 32 are electrically connected to the touch signal lines TX, and the input terminal 31 is electrically connected to the power-supply chip 11. The driving chip 3 includes a first side edge B1 and a second side edge B2 that are opposite, and both of the first side edge B1 and the second side edge B2 extend in a direction from the active area AA pointing to the bonding region BD. For a same driving chip 3, a resistance value between a first output terminal of the driving chip 3 and the power-supply chip 11 is substantially equal to a resistance value between a second output terminal of the driving chip 3 and the power-supply chip 11, wherein the first output terminal refers to the output terminal 32 that has a lowest distance to the first side edge B1, and the second output terminal refers to the output terminal 32 that has a lowest distance to the second side edge B2.

It should be noted that, in an embodiment of the present application, all of the touch signal lines TX are provided within the active area AA. In some other embodiments, the touch signal lines TX may be provided within a peripheral region. In order to reduce a size of the peripheral region, and improve an aesthetic degree of the display product, the embodiments of the present application are illustrated by taking the case as an example in which all of the touch signal lines TX are provided within the active area AA.

In an exemplary embodiment, a material of the common-electrode units 4 is a light-transmitting electrically conductive material, for example, indium tin oxide (ITO) and indium zinc oxide (IZO).

The shapes and the sizes of the common-electrode units 4 are not limited herein.

As an example, the planar shapes of the common-electrode units 4 may be a polygon, an arc shape, or a combination of a polygon and an arc shape. For example, the polygon may include a quadrangle, a pentagon, a hexagon and so on. For example, the arc shape may include a sector shape, a circular shape, an elliptical shape, a semicircular shape, a semi-elliptical shape and so on. The combination of a polygon and an arc shape includes a pattern formed by removing a part of the area from a polygon or an arc shape and a pattern formed by splicing a part of the area of a polygon or an arc shape, and the pattern of the removed or spliced part of the area may include a polygon or an arc shape.

As an example, each of the common-electrode units 4 may cover a plurality of pixel units. For example, the common-electrode unit 4 may cover four pixel units. Alternatively, the common-electrode unit 4 may cover six pixel units. Alternatively, the common-electrode unit 4 may cover nine pixel units. In other words, a planar size of the common-electrode unit 4 may be greater than or equal to a planar size of four pixel units. Alternatively, the planar size of the common-electrode unit 4 may be greater than or equal to a planar size of six pixel units. Alternatively, the planar size of the common-electrode unit 4 may be greater than or equal to a planar size of nine pixel units.

The driving chip 3 may be configured to provide display driving signals and touch driving signals. As an example, the driving chip 3 may be a touch and display driver integration (TDDI) type driving chip. Alternatively, the driving chip 3 may be an SR (Source/Read-out IC) type driving chip.

As an example, the display products of the technique of TDDI may include an advanced super dimension switch (ADS) type liquid-crystal touch display screen or HADS-type liquid-crystal touch display screen.

In an exemplary embodiment, the mainboard 1 may include a printed circuit board (PCBA). The mainboard 1 includes at least a power-supply chip 11, a timing controller (TCON) and a microprocessor (Microcontroller Unit, MCU).

The power-supply chip 11 may be a power-supply managing chip (Power Management Integrated Circuits, PMIC).

The input terminal refers to a port in the driving chip 3 that is used to transmit a signal inputted by the mainboard 1 to the driving chip 3. The output terminals refer to ports in the driving chip 3 that are used to transmit signals to the active area AA of the display module.

The display module includes an array base board 100, the driving chip 3 is bonded within the bonding region BD of the array base board 100, and the output terminals of the driving chip 3 are configured to transmit signals to the array base board 100.

It should be noted that the driving chip 3 includes at least one input terminal for transmitting a common-voltage signal. All of the input terminals involved in the embodiments of the present application refer to an input terminal for transmitting the common-voltage signal. In practical applications, the driving chip 3 may include a plurality of other similar input terminals for transmitting other signals than the common-voltage signal.

The "substantially equal to" in that the resistance value between the first output terminal and the power-supply chip is substantially equal to the resistance value between the second output terminal and the power-supply chip includes the cases of a certain tolerance, taking into consideration that the measurement and the tolerances relevant to the measurement on particular quantities (for example, restricted by the measuring system), and represents that it is in the acceptable deviation ranges of the particular values determined by a person skilled in the art. For example, the "substantially equal to" can represent that it is within one or more standard deviations, or within 3% or 5% of the values.

All of the following cases fall within the range of the cases included by the "substantially equal to":

As an example, the difference between the resistance value between the first output terminal and the power-supply chip and the resistance value between the second output terminal and the power-supply chip is less than or equal to 1%, 2% or 3% of the resistance value between the first output terminal and the power-supply chip. As an example, the difference between the resistance value between the first output terminal and the power-supply chip and the resistance value between the second output terminal and the power-supply chip is less than or equal to 1%, 2% or 3% of the resistance value between the second output terminal and the power-supply chip.

Figure 3:
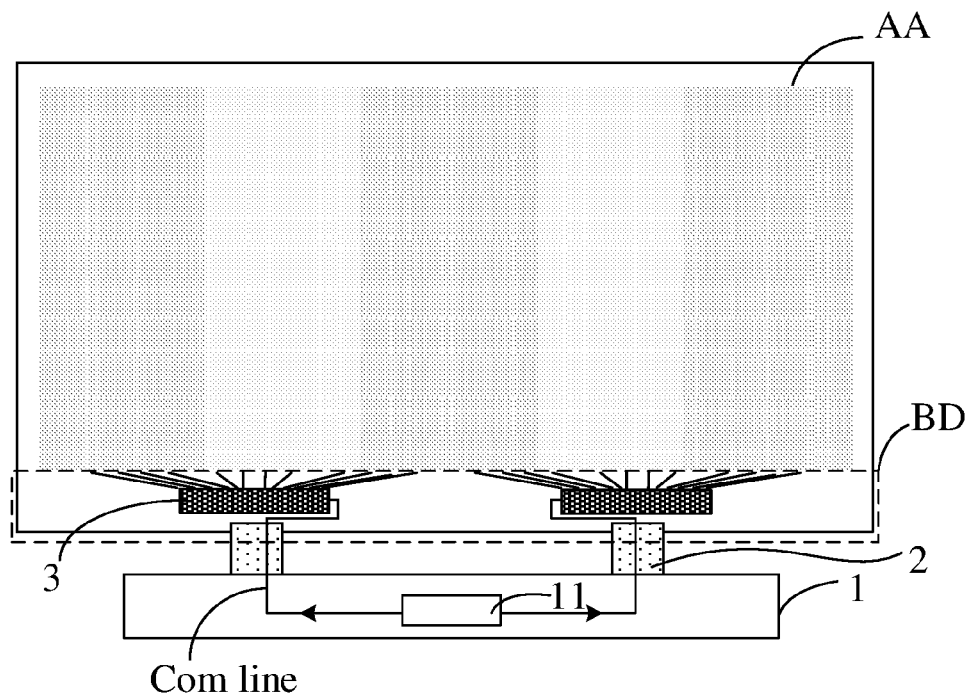
FIGS. 3 and 4 are schematic diagrams of the unequal brightnesses of the display frames of two types of touch display modules according to embodiments of the present application.
Figure 10:
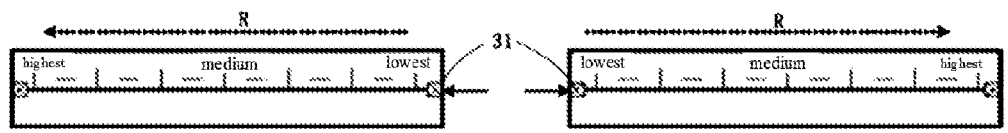
FIG. 10 is a schematic diagram of the variation of the impedances of the output terminals of the driving chips with the distances between the output terminals and the input terminals according to an embodiment of the present application.

In the related art, as shown in FIG. 3, because the common-electrode line (Com line) is inputted from a single side of the driving chip 3, for the same driving chip 3, for example, the driving chip 3 at the left side of FIG. 3, the common-voltage signal (Vcom signal) transmitted by the common-electrode line (Com line) is inputted from the right side of the driving chip 3. Because the interior of the driving chip 3 itself has the internal resistance, for the output terminals outputting signals from the driving chip 3, the output terminal that has a higher distance to the right side of the driving chip 3 has a higher internal resistance, and correspondingly the touch signal line TX electrically connected to the output terminal has a higher voltage drop. When the display product has a large load, the common-electrode block 4, after pulled by the data-signal line, recovers slowly. In this way, under the additive effect of the plurality of factors, within the active area AA of the display product it is presented that, regarding the touch signal line TX electrically connected to the output terminal that has a lower distance to the common-voltage-signal input terminal of the driving chip 3, the display frame within the local region where it is located has a higher brightness, and regarding the touch signal line TX electrically connected to the output terminal that has a higher distance to the common-voltage-signal input terminal of the driving chip 3, the display frame within the local region where it is located has a lower brightness. The unequal brightnesses of the different regions within the active area AA, for example, the phenomenon of screen splitting is resulted in. It should be noted that, as shown in FIG. 10, when the output terminal has a higher distance to the common-voltage-signal input terminal of the driving chip 3, the resistance R is higher, and when the output terminal has a lower distance to the common-voltage-signal input terminal of the driving chip 3, the resistance R is lower.

In the display module according to the embodiments of the present application, by configuring that the resistance value between the first output terminal and the power-supply chip 11 is substantially equal to the resistance value between the second output terminal and the power-supply chip 11, wherein the first output terminal refers to the output terminal 32 that has the lowest distance to the first side edge B1, and the second output terminal refers to the output terminal 32 that has the lowest distance to the second side edge B2, the internal resistance of the traces or electrically conducting components for transmitting the common-voltage signals can be significantly reduced, thus the resistance values between the different output terminals 32 and the power-supply chip 11 tend to be equal, to reduce the differences in the resistance values between the different output terminals 32 and the power-supply chip 11, thereby the problem of ununiform brightness of the display frames of display modules is ameliorated.

In at least one embodiment of the present application, as shown in FIGS. 6 and 7, the driving chip 3 includes a first signal line 33, and the first signal line 33 contacts and is connected to all of the output terminals 32, and is electrically connected to the input terminal 31. The resistance R1 between the first output terminal and the midpoint of the first signal line 33 is substantially equal to the resistance R2 between the second output terminal and the midpoint of the first signal line 33.

In an exemplary embodiment, the resistance between the first output terminal and the input terminal 31 is substantially equal to the resistance between the second output terminal and the input terminal 31.

In an exemplary embodiment, an extending direction of the first signal line 33 intersects with the extending directions of the output terminals 32.

In an exemplary embodiment, that the first signal line 33 is electrically connected to the input terminal 31 includes that, as shown in FIG. 7, the first signal line 33 contacts and is electrically connected to the input terminal 31. Alternatively, as shown in FIG. 6, the first signal line 33 is indirectly electrically connected to the input terminal 31.

The "substantially equal to" in that the resistance R1 between the first output terminal and the midpoint of the first signal line 33 is substantially equal to the resistance R2 between the second output terminal and the midpoint of the first signal line 33 includes "approximately equal to" and "equal to", wherein the "approximately equal to" includes but is not limited to the case that the difference between the resistance R1 between the first output terminal and the midpoint of the first signal line 33 and the resistance R2 between the second output terminal and the midpoint of the first signal line 33 is less than or equal to a preset value. For example, the preset value may be 1%, 2%, 3%, 4% or 5% of the resistance R1 (or the resistance R2).

In at least one embodiment of the present application, as shown in FIG. 6, the first signal line 33 is indirectly electrically connected to the input terminal 31.

In at least one embodiment of the present application, as shown in FIG. 6, the driving chip 3 further includes a second signal line 34 and a third signal line 35, an extending trend of the second signal line 34 is the same as an extending trend of the first signal line 33, and an extending trend of the third signal line 35 intersects with the extending trend of the second signal line 34. One end of the third signal line 35 contacts and is connected to a midpoint position of the first signal line 33, and the other end of the third signal line 35 is electrically connected to the second signal line 34.

The input terminal 31 of the driving chip 3 is disposed on one of the first side edge B1 and the second side edge B2, and the input terminal 31 contacts and is connected to one end of the second signal line 34.

It should be noted that the first signal line 33, the second signal line 34 and the third signal line 35 of the driving chip 3 according to the embodiments of the present application are not necessarily straight lines, and may also be bent or curved to a certain extent, as long as the overall signal lines have an trend of extending in a direction.

In addition, that the extending trend of the second signal line 34 is the same as the extending trend of the first signal line 33 does not mean that the two signal lines are parallel.

In the embodiments of the present application, as shown in FIG. 6, by configuring that the driving chip 3 includes the second signal line 34 and the third signal line 35, the extending trend of the second signal line 34 is the same as the extending trend of the first signal line 33, and the extending trend of the third signal line 35 intersects with the extending trend of the second signal line 34. One end of the third signal line 35 contacts and is connected to a midpoint position of the first signal line 33, and the other end of the third signal line 35 is electrically connected to the second signal line 34, in this way, when merely one input terminal 31 is disposed (in other words, the original position of the input terminal of the driving chip 3 is not changed), the resistance R1 between the first output terminal and the midpoint of the first signal line 33 is caused to be substantially equal to the resistance R2 between the second output terminal and the midpoint of the first signal line 33. Therefore, the resistance values R1 and R2 between the output terminals 32 at the two sides of the same driving chip 3 (the output terminal 32 closer to the first side edge B1 and the output terminal 32 closer to the second side edge B2) and the input terminal 31 of the driving chip 3 tend to be equal or close, thus the resistance values between the different output terminals 32 and the power-supply chip 11 tend to be equal, to reduce the differences in the resistance values between the different output terminals 32 and the power-supply chip 11, thereby the problem of ununiform brightness of the display frames of display modules is ameliorated.

In at least one embodiment of the present application, as shown in FIG. 7, the first signal line 33 directly contacts and is directly connected to the input terminal 31.

In at least one embodiment of the present application, as shown in FIG. 7, the driving chip includes two input terminals 31, the two input terminals 31 are disposed on the first side edge B1 and the second side edge B2, and the two input terminals 31 contact and are connected to two ends of the first signal line 33, respectively.

In the embodiments of the present application, by changing the quantity of the common-voltage-signal input terminal 31 of the driving chip 3, the first side edge B1 and the second side edge B2 of the driving chip 3 are caused to be individually provided with one input terminal 31, thus the resistance values R1 and R2 between the output terminals 32 at the two sides of the same driving chip 3 (the output terminal 32 closer to the first side edge B1 and the output terminal 32 closer to the second side edge B2) and the input terminal 31 of the driving chip 3 tend to be equal or close, to reduce the difference in the resistance value between the first output terminal and the second output terminal of the same driving chip 3, thereby the problem of ununiform brightness of the display frames of display modules is ameliorated.

Figure 8:
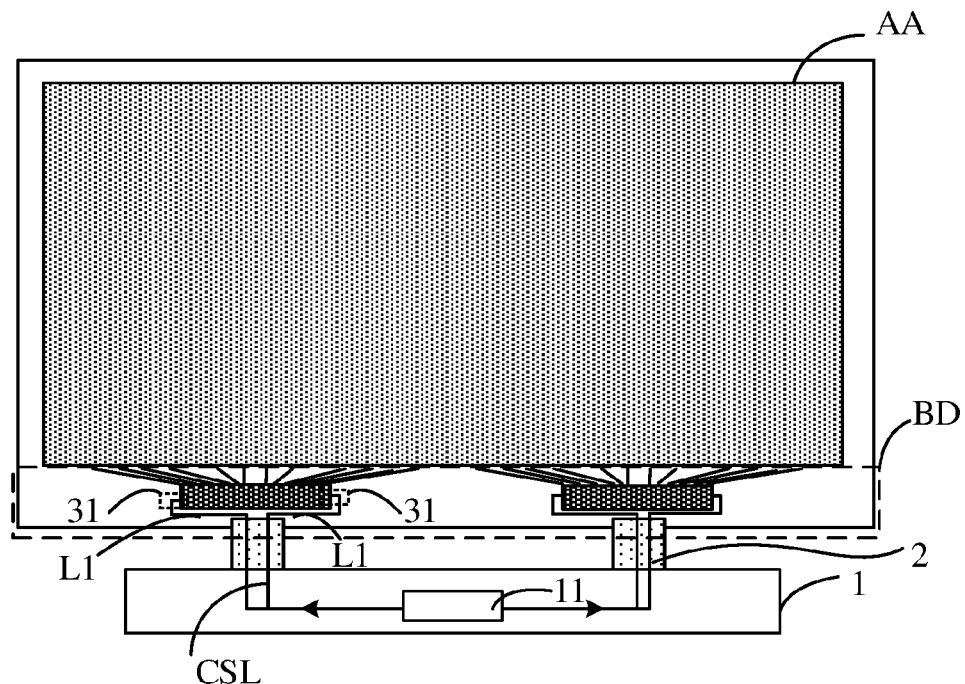
FIG. 8 is a schematic structural diagram of another touch display module according to an embodiment of the present application.

In at least one embodiment of the present application, as shown in FIG. 8, the display module further includes at least one flexible circuit board 2 and at least one power-supply-signal transmitting line set. The power-supply chip 11, the flexible circuit board 2 and the input terminal 31 of the driving chip 3 are sequentially electrically connected. The quantity of the driving chip 3, the quantity of the flexible circuit board 2 and the quantity of the power-supply-signal transmitting line set are equal.

The power-supply-signal transmitting line set includes at least one power-supply-signal transmitting line CSL, the power-supply-signal transmitting line CSL passes through the flexible circuit board 2 from the mainboard 1 and extends to the bonding region BD, and the power-supply-signal transmitting line CSL is electrically connected to the input terminal 31 of the driving chip 3.

As shown in FIG. 8, the quantity of the power-supply-signal transmitting line CSL passing through a same flexible circuit board 2 in the power-supply-signal transmitting line set is equal to a quantity of the input terminal 31 of a same driving chip 3 electrically connected to the flexible circuit board 2.

For example, as shown in FIG. 8, the quantity of the power-supply-signal transmitting line CSL passing through the same flexible circuit board 2 in the power-supply-signal transmitting line set is two, and the quantity of the input terminal 31 of the driving chip 3 electrically connected to the flexible circuit board 2 is two.

In the embodiments of the present application, by configuring that the quantity of the power-supply-signal transmitting line CSL passing through the same flexible circuit board 2 in the power-supply-signal transmitting line set is equal to the quantity of the input terminal 31 of the same driving chip 3 electrically connected to the flexible circuit board 2, all of the part of the line segments of the power-supply-signal transmitting lines CSL that is located at the mainboard 1 and the part of the power-supply-signal transmitting lines CSL that is located at the flexible circuit board 2 are changed with the changing of the configuration of the input terminals 31 of the driving chip 3, to reduce the difference in the resistance value between the first output terminal and the second output terminal of the same driving chip 3, thereby the problem of ununiform brightness of the display frames of display modules is ameliorated.

Figure 11:
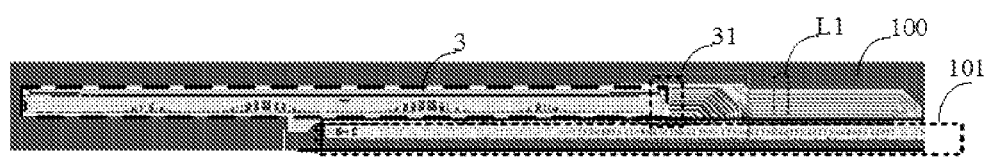
FIG. 11 is a locally schematic structural diagram of an array base board according to an embodiment of the present application.

In at least one embodiment of the present application, referring to FIGS. 8 and 11, a first bonding part 101 and a plurality of first connecting lines L1 are provided within the bonding region BD, the first bonding part 101 is located at the side of the driving chip 3 away from the active area AA, and the first bonding part 101 is electrically connected to the flexible circuit board 2 and the first connecting lines L1.

When the driving chip 3 includes two input terminals 31, the first connecting lines L1 include a first part and a second part, the first connecting lines L1 of the first part are electrically connected to the first bonding part 101 and one of the input terminals 31, respectively, and the first connecting lines L1 of the second part are electrically connected to the first bonding part 101 and the other of the input terminals 31.

In an exemplary embodiment, the first connecting lines L1 of the first part and the first connecting lines L1 of the second part may be arranged symmetrically.

It should be noted that FIG. 11 illustrates the case in which the driving chip 3 includes one input terminal 31.

Figure 12:
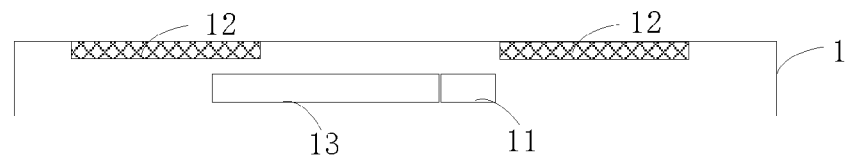
FIG. 12 is a simplified schematic structural diagram of a mainboard according to an embodiment of the present application.

As an example, as shown in FIG. 12, the mainboard 1 of the display module may further include at least one second bonding part 12, and the second bonding part 12 and the flexible circuit board 2 are bonded together. Certainly, the mainboard 1 may further include the time schedule controller and the microprocessor (they are overall labeled as 13).

Figure 13:
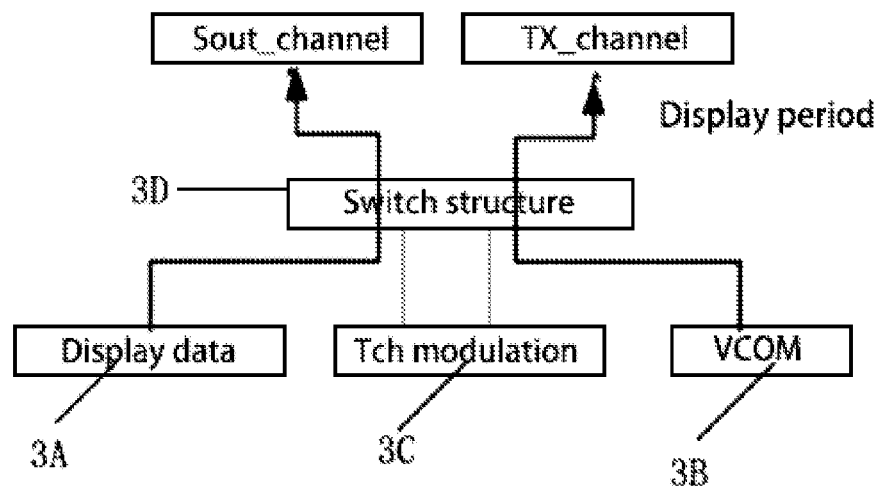
FIGS. 13 and 14 are diagrams for describing the operating principles of the driving chip according to an embodiment of the present application at the display stage and the touch stage.
Figure 14:
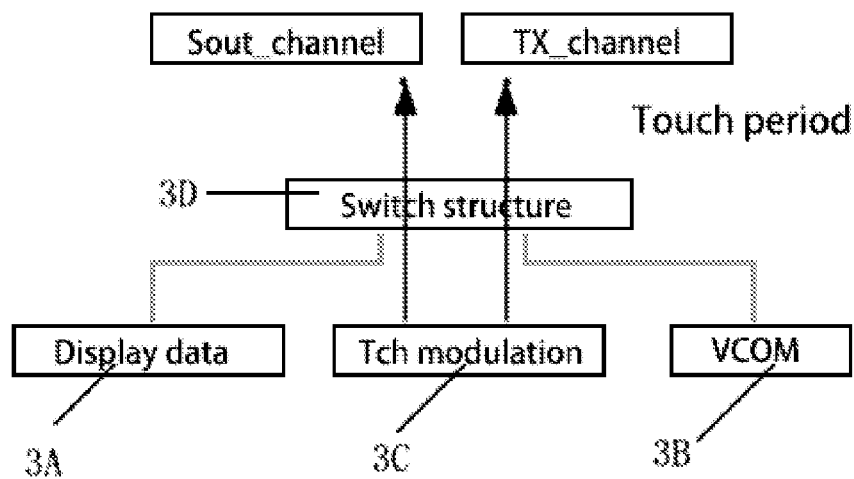

In at least one embodiment of the present application, as shown in FIGS. 13 and 14, the driving chip 3 includes a first storing unit 3A, a second storing unit 3B, a converting unit 3D and a touch unit 3C, and the first storing unit 3A, the second storing unit 3B and the touch unit 3C are electrically connected to the converting unit 3D. A plurality of pixel driving circuits arranged in an array and a plurality of data-signal lines DL (Data line) are provided within the active area AA, and one data-signal line is electrically connected to the same row of the pixel driving circuits. The converting unit 3D is electrically connected to the data-signal lines DL and the touch signal lines TX.

The first storing unit 3A is configured to store a displayed data signal Data, the second storing unit 3B is configured to store a common-voltage signal, and the touch unit 3C is configured to store a touch signal.

As shown in FIG. 13, at the display stage (Display period), the converting unit 3D is configured to control the first storing unit 3A and the data-signal lines DL to be conducted, and is further configured to control the second storing unit 3B and the touch signal lines TX to be conducted. The displayed data signal stored in the first storing unit 3A is transmitted to the data-signal lines DL, and the common-voltage signal stored in the second storing unit 3B is transmitted to the common-electrode unit 4 (Vcom Sensor) via the touch signal lines TX. The Sout-channel (data-line channel) shown in FIG. 13 outputs the displayed data signal, and the TX-channel (touch-line channel) outputs the common-voltage signal.

As shown in FIG. 14, at the touch stage, the converting unit 3D is configured to control the touch unit 3C to be conducted with the data-signal lines DL and the touch signal lines TX. Both of the Sout-channel (data-line channel) and the TX-channel (touch-line channel) shown in FIG. 14 output the scanning square signals (Modulation signals).

As an example, if the display module has M rows and N columns of the common-electrode units 4, then, within the touch duration of one frame, M*N common-electrode units 4 are completely scanned.

In the embodiments of the present application, because it is configured that, in the same driving chip 3, the resistance R1 between the first output terminal and the midpoint of the first signal line 33 is substantially equal to the resistance R2 between the second output terminal and the midpoint of the first signal line 33. In this way, at the display stage, even if the signals transmitted in the data-signal lines DL are performed polarity reversal, when the common-electrode units 4 are pulled in the same direction as influenced by the signals transmitted in the data-signal lines DL, because the difference in the resistances of the common-voltage signals outputted from the output terminals 32 of the driving chip 3 to the TX-channel (touch-line channel) is very low, the probability that the display frame has ununiform brightnesses is reduced, thereby the uniformity of the display frame is increased, and the image quality and the effect of display are improved.

Figure 4:
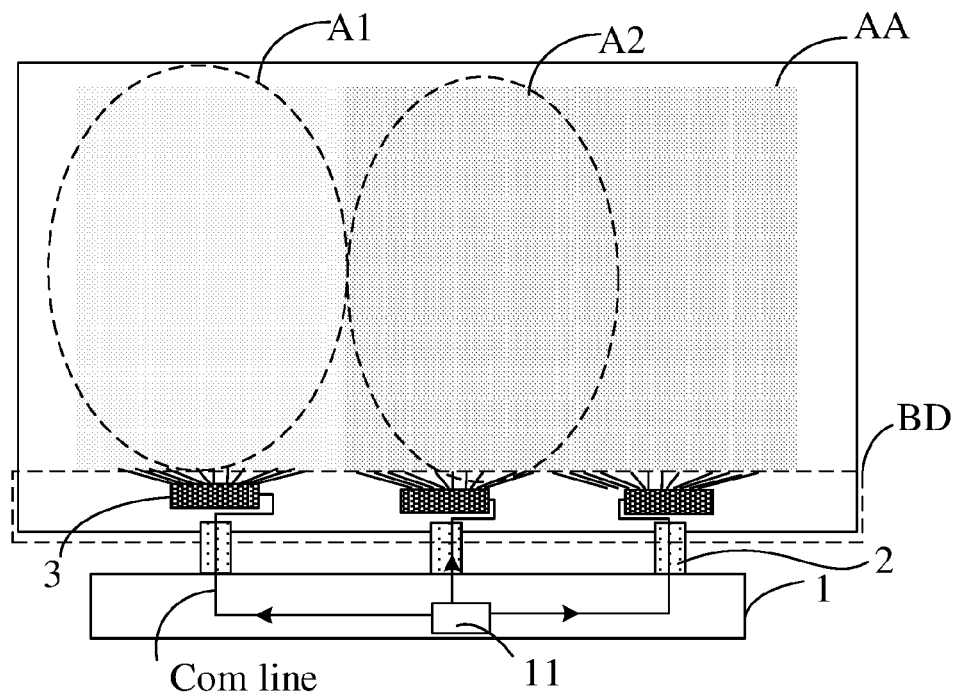
Figure 5:
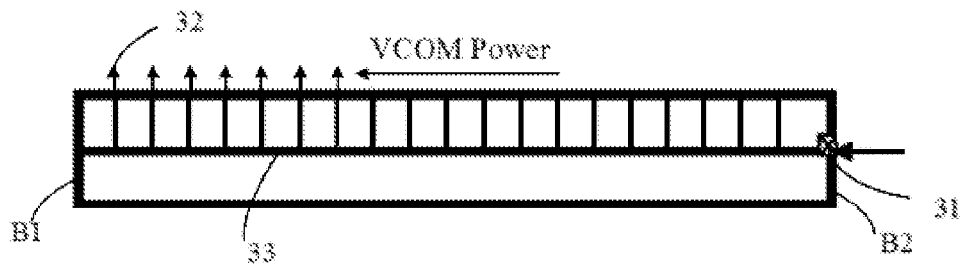
FIG. 5 is a simplified schematic structural diagram of a driving chip in the related art.

In the related art, when both of the common-voltage-signal input terminals of two neighboring driving chips 3 are located at the same side of the driving chips 3, for example, as shown in FIG. 4, when both of the common-voltage-signal input terminals of the driving chip 3 at the left side and the driving chip 3 in the middle are located at the right side, regarding the driving chip 3 at the left side, regarding the touch signal line TX electrically connected to the output terminal that has the lowest distance to the common-voltage-signal input terminal of the driving chip 3, the display frame within the local region where it is located has the highest brightness, and regarding the driving chip 3 in the middle, regarding the touch signal line TX electrically connected to the output terminal that has the highest distance to the common-voltage-signal input terminal of the driving chip 3, the display frame within the local region where it is located has the lowest brightness. In this way, the region of the brightest display frame controlled by the driving chip 3 at the left side and the region of the darkest display frame controlled by the driving chip 3 in the middle are adjacent, which results in an obvious contrast, and presents unequal brightnesses between the regions that are controlled by the two neighboring driving chips 3 (also referred to as the phenomenon of screen splitting between the different driving chips). FIG. 5 is a simplified schematic structural diagram of the driving chip 3 at the left side and the driving chip 3 in the middle in FIG. 4.

Figure 9:
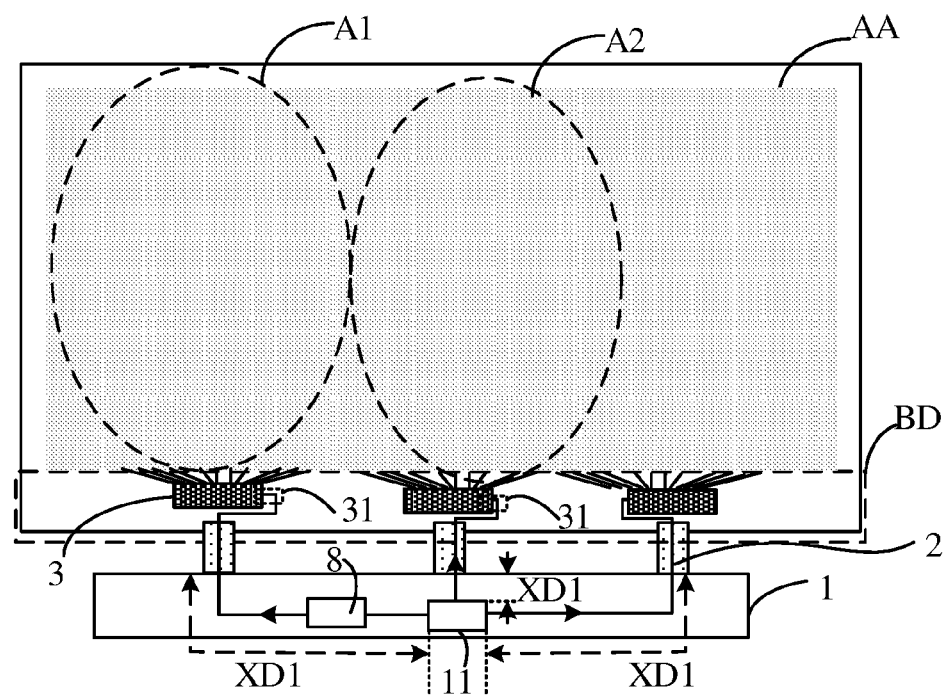
FIG. 9 is a schematic structural diagram of yet another touch display module according to an embodiment of the present application.

In at least one embodiment of the present application, as shown in FIG. 9, the display module includes at least two driving chips 3 and at least two power-supply-signal transmitting line sets, each of the power-supply-signal transmitting line sets includes at least one power-supply-signal transmitting line (which are also referred to as a Com line), the power-supply-signal transmitting lines pass through the flexible circuit board 2 from the mainboard 1 and extend to the bonding region BD, and the power-supply-signal transmitting line is electrically connected to the input terminal 31 of the driving chip 3.

Each of the power-supply-signal transmitting lines includes a first line segment XD1, the first line segment XD1 is disposed on the mainboard 1, and the first line segment XD1 is connected to the flexible circuit board 2 and the power-supply chip 11. The mainboard 1 further includes a resistance regulating module 8, and at least a part of the first line segment XD1 is further provided with the resistance regulating module 8.

In at least one embodiment of the present application, each of the first line segments XD1 is provided with the resistance regulating module 8, and the resistance regulating module 8 includes an adjustable resistor.

In at least one embodiment of the present application, each of the driving chips 3 includes one input terminal 31. As shown in FIG. 9, the display module includes a first driving chip (for example, the driving chip at the left side) and a second driving chip (for example, the driving chip in the middle), and both of the input terminal 31 of the first driving chip and the input terminal 31 of the second driving chip are located on the first side edge B1 or located on the second side edge B2. In other words, the display module includes two driving chips whose input terminals 31 are located at the same side.

As shown in FIG. 9, the first driving chip is configured to control a first region A1 within the active area AA, the second driving chip is configured to control a second region A2 within the active area AA, and an initial brightness of the first region A1 is greater than an initial brightness of the second region A2. The first line segment XD1 that is electrically connected to the first driving chip is provided with the resistance regulating module 8.

The initial brightness of the first region A1 and the initial brightness of the second region A2 refer to the brightnesses when the display module is not provided with the resistance regulating module 8, or refer to the brightnesses when the resistance of the resistance regulating module 8 is zero ohm.

In an exemplary embodiment, the resistance regulating module 8 includes an adjustable resistor.

In at least one embodiment of the present application, the resistance value of the resistance regulating module 8 is substantially equal to an internal-resistance value of the second driving chip.

In the embodiments of the present application, before the resistance regulating module 8 is disposed, regarding the driving chip 3 at the left side (i.e., the first driving chip), regarding the touch signal line TX electrically connected to the output terminal 32 that has the lowest distance to the input terminal 31 of the first driving chip, the display frame within the local region where it is located has the highest brightness, and regarding the driving chip 3 in the middle (i.e., the second driving chip), regarding the touch signal line TX electrically connected to the output terminal 32 that has the highest distance to the input terminal 31 of the second driving chip 3, the display frame within the local region where it is located has the lowest brightness. The difference between the resistances of the two output terminals 32 is substantially the internal-resistance value of the second driving chip 3. In the embodiments of the present application, by configuring that the resistance value of the resistance regulating module 8 is substantially equal to the internal-resistance value of the second driving chip, the resistance values between the output terminal 32 that has the lowest distance to the input terminal 31 of the first driving chip and the output terminal 32 that has the highest distance to the input terminal 31 of the second driving chip 3 and the input terminals 31 of the respective driving chips 3 can tend to be equal, to reduce the difference between the resistance values of the output terminals 32 of the two neighboring driving chips 3, thereby the problem of ununiform brightness of the display frames of display modules is ameliorated.

In at least one embodiment of the present application, orthographic projections of at least a part of the line segments of the data-signal lines DL on a substrate of the display module overlap with orthographic projections of the common-electrode units 4 on the substrate.

At the touch stage, all of the data-signal lines DL and the touch signal lines TX are configured to transmit scanning square signals, and the polarities of the scanning square signals that are transmitted by the data-signal lines DL and the touch signal lines TX are the same.

That the polarities are the same means that the scanning square signals that are transmitted by the data-signal lines DL and the touch signal lines TX are all at a high level within one same time period, and are all at a low level within another same time period.

As an example, the amplitudes of the scanning square signals that are transmitted by the data-signal lines DL and the touch signal lines TX may be unequal.

In the display module according to the embodiments of the present application, because the orthographic projections of at least a part of the line segments of the data-signal lines DL on the substrate of the display module overlap with the orthographic projections of the common-electrode units 4 on the substrate, there are parasitic capacitances formed between the data-signal lines DL and the common-electrode units 4, and by configuring that the polarities of the scanning square signals that are transmitted by the data-signal lines DL and the touch signal lines TX are the same, it can be prevented that the signals in the data-signal lines DL, in polarity reversal, adversely affect the touch signals in the common-electrode units 4, to prevent deteriorating the signal stability, thereby the touch performance of the display module is improved while the stability of the signal transmission is improved.

A touch display device is provided by an embodiment of the present application, wherein the touch display device includes the display module described above.

As an example, the specific structure of the display module included by the touch display device may be referred to the above description, and is not discussed further herein.

As an example, the touch display device may be an advanced super dimension switch (ADS) type liquid-crystal touch display device or HADS-type liquid-crystal touch display device.

The touch display device may be a touch display panel, and any product or component having the function of displaying and including the touch display panel, such as a television set, a digital camera, a mobile phone and a tablet personal computer.

In the touch display device according to the embodiments of the present application, by configuring that the resistance value between the first output terminal and the power-supply chip 11 is substantially equal to the resistance value between the second output terminal and the power-supply chip 11, wherein the first output terminal refers to the output terminal 32 that has the lowest distance to the first side edge B1, and the second output terminal refers to the output terminal 32 that has the lowest distance to the second side edge B2. In this way, the internal resistance of the traces or electrically conducting components for transmitting the common-voltage signals can be significantly reduced, so that the resistance values between the different output terminals 32 and the power-supply chip 11 tend to be equal, the differences in the resistance values between the different output terminals 32 and the power-supply chip 11 are reduced, thereby the problem of ununiform brightness of the display frames of display modules is ameliorated.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. A display module, comprising an active area and a bonding region located at one side of the active area; wherein a plurality of touch signal lines and a plurality of common-electrode units are provided within the active area, and the common-electrode units are electrically connected to the touch signal lines; at least one driving chip is provided within the bonding region; the display module further comprises a mainboard, and the mainboard comprises a power-supply chip;

each of the at least one driving chip comprises a plurality of output terminals and at least one input terminal; the output terminals are electrically connected to the touch signal lines, and each of the at least one input terminal is electrically connected to the power-supply chip;

each of the at least one driving chip comprises a first side edge and a second side edge that are opposite, and both of the first side edge and the second side edge extend in a direction from the active area pointing to the bonding region; and for a same instance of the at least one driving chip, a resistance value between a first output terminal of the driving chip and the power-supply chip is substantially equal to a resistance value between a second output terminal of the driving chip and the power-supply chip, wherein the first output terminal refers to an instance of the output terminals that has a lowest distance to the first side edge, and the second output terminal refers to an instance of the output terminals that has a lowest distance to the second side edge.

2. The display module according to claim 1, wherein each of the at least one driving chip comprises a first signal line, and the first signal line contacts and is connected to all of the output terminals, and is electrically connected to the input terminal; and a resistance between the first output terminal and a midpoint of the first signal line is substantially equal to a resistance between the second output terminal and the midpoint of the first signal line.

3. The display module according to claim 2, wherein the first signal line is indirectly electrically connected to the input terminal.

4. The display module according to claim 3, wherein each of the at least one driving chip further comprises a second signal line and a third signal line, an extending trend of the second signal line is the same as an extending trend of the first signal line, and an extending trend of the third signal line intersects with the extending trend of the second signal line; one end of the third signal line contacts and is connected to a midpoint position of the first signal line, and the other end of the third signal line is electrically connected to the second signal line; and the input terminal of each of the at least one driving chip is disposed on one of the first side edge and the second side edge, and the input terminal contacts and is connected to one end of the second signal line.

5. The display module according to claim 4, wherein the display module further comprises at least one flexible circuit board and at least one power-supply-signal transmitting line set; the power-supply chip, the at least one flexible circuit board and the input terminal of each of the at least one driving chip are sequentially electrically connected; a quantity of the driving chip, a quantity of the at least one flexible circuit board and a quantity of the power-supply-signal transmitting line set are equal;

the power-supply-signal transmitting line set comprises at least one power-supply-signal transmitting line, each of the at least one power-supply-signal transmitting line passes through each of the at least one flexible circuit board from the mainboard and extends to the bonding region, and the power-supply-signal transmitting line is electrically connected to the input terminal of each of the at least one driving chip; and a quantity of the at least one power-supply-signal transmitting line passing through a same flexible circuit board in the power-supply-signal transmitting line set is equal to a quantity of the input terminal of a same driving chip electrically connected to the flexible circuit board.

6. The display module according to claim 5, wherein a first bonding part and a plurality of first connecting lines are provided within the bonding region, the first bonding part is located at one side of the at least one driving chip away from the active area, and the first bonding part is electrically connected to the flexible circuit board and the first connecting lines; and when each of the at least one driving chip comprises two instances of the input terminal, the first connecting lines comprise a first part and a second part, the first connecting lines of the first part are electrically connected to the first bonding part and one of the input terminals, and the first connecting lines of the second part are electrically connected to the first bonding part and the other of the input terminals.

7. The display module according to claim 5, wherein each of the at least one driving chip comprises a first storing unit, a second storing unit, a converting unit and a touch unit, and the first storing unit, the second storing unit and the touch unit are electrically connected to the converting unit, respectively; a plurality of pixel driving circuits arranged in an array and a plurality of data-signal lines are provided within the active area, and one of the plurality of data-signal lines is electrically connected to a same row of the pixel driving circuits; the converting unit is electrically connected to the data-signal lines and the touch signal lines;

the first storing unit is configured to store a displayed data signal, the second storing unit is configured to store a common-voltage signal, and the touch unit is configured to store a touch signal;

at a display stage, the converting unit is configured to control the first storing unit and the data-signal lines to be conducted, and is further configured to control the second storing unit and the touch signal lines to be conducted; and at a touch stage, the converting unit is configured to control the touch unit to be conducted with the data-signal lines and the touch signal lines, respectively.

8. The display module according to claim 7, wherein orthographic projections of at least a part of line segments of the data-signal lines on a substrate of the display module overlap with orthographic projections of the common-electrode units on the substrate; and at the touch stage, all of the data-signal lines and the touch signal lines are configured to transmit scanning square signals, and polarities of the scanning square signals that are transmitted by the data-signal lines and the touch signal lines are the same.

9. The display module according to claim 2, wherein the first signal line directly contacts and is directly connected to the input terminal.

10. The display module according to claim 9, wherein each of the at least one driving chip comprises two instances of the input terminal, the two input terminals are disposed on the first side edge and the second side edge, respectively, and the two input terminals contact and are connected to two ends of the first signal line.

11. The display module according to claim 10, wherein the display module further comprises at least one flexible circuit board and at least one power-supply-signal transmitting line set; the power-supply chip, the at least one flexible circuit board and the input terminal of each of the at least one driving chip are sequentially electrically connected; a quantity of the driving chip, a quantity of the at least one flexible circuit board and a quantity of the power-supply-signal transmitting line set are equal;

the power-supply-signal transmitting line set comprises at least one power-supply-signal transmitting line, each of the at least one power-supply-signal transmitting line passes through each of the at least one flexible circuit board from the mainboard and extends to the bonding region, and the power-supply-signal transmitting line is electrically connected to the input terminal of each of the at least one driving chip; and a quantity of the at least one power-supply-signal transmitting line passing through a same flexible circuit board in the power-supply-signal transmitting line set is equal to a quantity of the input terminal of a same driving chip electrically connected to the flexible circuit board.

12. The display module according to claim 1, wherein the display module comprises at least two driving chips and at least two power-supply-signal transmitting line sets, each power-supply-signal transmitting line set comprises at least one power-supply-signal transmitting line, the at least one power-supply-signal transmitting line passes through a flexible circuit board from the mainboard and extend to the bonding region, and the at least one power-supply-signal transmitting line is electrically connected to the at least one input terminal of each of the at least one driving chip;

each of the at least one power-supply-signal transmitting line comprises a first line segment, the first line segment is disposed on the mainboard, and the first line segment is connected to the flexible circuit board and the power-supply chip; and the mainboard further comprises a resistance regulating module, and at least a part of the first line segment is provided with the resistance regulating module.

13. The display module according to claim 12, wherein each first line segment is provided with the resistance regulating module, and the resistance regulating module comprises an adjustable resistor.

14. The display module according to claim 12, wherein each driving chip comprises one input terminal, the display module comprises a first driving chip and a second driving chip, and both of the input terminal of the first driving chip and the input terminal of the second driving chip are located on the first side edge or located on the second side edge;

the first driving chip is configured to control a first region within the active area, the second driving chip is configured to control a second region within the active area, and an initial brightness of the first region is greater than an initial brightness of the second region; and the first line segment electrically connected to the first driving chip is provided with the resistance regulating module.

15. The display module according to claim 14, wherein a resistance value of the resistance regulating module is substantially equal to an internal-resistance value of the second driving chip.

16. A touch display device, wherein the touch display device comprises the display module according to claim 1.

17. The touch display device according to claim 16, wherein each of the at least one driving chip comprises a first signal line, and the first signal line contacts and is connected to all of the output terminals, and is electrically connected to the input terminal; and a resistance between the first output terminal and a midpoint of the first signal line is substantially equal to a resistance between the second output terminal and the midpoint of the first signal line.

18. The touch display device according to claim 17, wherein the first signal line is indirectly electrically connected to the input terminal.

19. The touch display device according to claim 18, wherein each of the at least one driving chip further comprises a second signal line and a third signal line, an extending trend of the second signal line is the same as an extending trend of the first signal line, and an extending trend of the third signal line intersects with the extending trend of the second signal line; one end of the third signal line contacts and is connected to a midpoint position of the first signal line, and the other end of the third signal line is electrically connected to the second signal line; and the input terminal of each of the at least one driving chip is disposed on one of the first side edge and the second side edge, and the input terminal contacts and is connected to one end of the second signal line.

20. The touch display device according to claim 17, wherein the first signal line directly contacts and is directly connected to the input terminal.

\* \* \* \* \*